United States Patent [19]

Okumura

[11] Patent Number: 5,541,546

[45] Date of Patent: Jul. 30, 1996

[54] SIGNAL LEVEL CONVERSION CIRCUIT FOR CONVERTING A LEVEL OF AN INPUT VOLTAGE INTO A LARGER LEVEL

[75] Inventor: Kouichiro Okumura, Tokyo, Japan

[73] Assignee: NEC Corporation, Tokyo, Japan

[21] Appl. No.: 391,650

[22] Filed: Feb. 21, 1995

[30] Foreign Application Priority Data

Feb. 18, 1994 [JP] Japan .................................. 6-043368

[51] Int. Cl.[6] ............................................. H03L 5/00
[52] U.S. Cl. ................... 327/333; 326/63; 326/68
[58] Field of Search .................... 327/333, 205; 326/62, 63, 64, 68, 69, 70, 71, 72, 83, 80, 81, 82

[56] References Cited

U.S. PATENT DOCUMENTS

| | | | |
|---|---|---|---|
| 3,906,254 | 9/1975 | Lane et al. | 326/81 |
| 4,080,539 | 3/1978 | Stewart | 326/81 |
| 4,571,504 | 2/1986 | Iwamoto et al. | 327/404 |
| 4,603,264 | 7/1986 | Nakano | 327/206 |
| 5,111,076 | 5/1992 | Tarng | 326/83 |

FOREIGN PATENT DOCUMENTS 2-134918  5/1990  Japan .

*Primary Examiner*—Timothy P. Callahan
*Assistant Examiner*—Kenneth B. Wells
*Attorney, Agent, or Firm*—Foley & Lardner

[57] ABSTRACT

A signal level conversion circuit is constructed with an inverter (103, 104) provided between a voltage source terminal (V2) and ground, first and second enhancement NMOS transistors (101, 107) connected in parallel to each other and provided between a signal input terminal (I) and an input node of an inverter. An enhancement PMOS transistor (102) is provided between the input node of the inverter and the voltage source terminal (V2). Gate electrodes of the first NMOS and the PMOS transistors are connected to an output of the inverter and a gate electrode of the second NMOS transistor (107) is connected to a constant voltage source (V1) of which voltage level is greater than a threshold voltage of the second NMOS transistor (107) and smaller than a sum of an input signal voltage inputted to the input terminal and the threshold voltage of the second NMOS transistor.

7 Claims, 4 Drawing Sheets

SIGNAL LEVEL CONVERSION CIRCUIT FOR CONVERTING A LEVEL OF AN INPUT VOLTAGE INTO A LARGER LEVEL

BACKGROUND OF THE INVENTION

The present invention relates to a transistor circuit and, particularly, to a level converter circuit for receiving and converting a signal from a circuit operating on a first power voltage into a signal for another circuit operating on a second power voltage.

Increase of power consumption of an integrated circuit is considerable due to recent increase in integration density of integrated circuits and increase of operating frequency thereof. In order to restrict the increase of power consumption, reduction of power source voltage has been studied. In considering the reduction of power source voltage, there may be two cases, one in which a low voltage power sources of, for example, 3 V for operating an internal circuit of a device and a high voltage power source of, for example, 5 V for operating an input/output portion of the device as in a conventional integrated circuit are used and the other in which integrated circuits which operate with power source voltages of 3 V and 5 V, respectively, are arranged mixedly within a single device.

In either of these two cases, it is necessary to convert a signal having an amplitude of 3 V into a signal having an amplitude of 5 V. That is, a transistor circuit for a purpose of level conversion is needed. For example, in the former case, a conversion from 3 V to 5 V is required in an interface portion between the internal circuit operating with 3 V and the input/output portion operating with 5 V and, in the latter case, such conversion is required in an input circuit portion of an integrated circuit of 5 V for receiving a signal output from an integrated circuit of 3 V thereof.

When a CMOS inverter circuit is used for such a signal level conversion, however, both a P channel MOS transistor and an N channel MOS transistor which constitute the CMOS inverter circuit are turned on in a period during which an input signal is in a high level and therefore a DC current flows, resulting in an increase of power consumption.

A first example of a conventional level conversion circuit using a CMOS inverter circuit will be described in detail with reference to FIG. 5.

In FIG. 5, an output terminal of a circuit portion connected to a terminal V1 of a low source voltage (e.g. 3 V) constituted with a P channel MOS transistor (referred to as PMOS, hereinafter) 108 and an N channel MOS transistor (referred to as NMOS, hereinafter) 109 is connected to an input terminal I of a circuit portion which is connected to a terminal V2 of a high source voltage (e.g., 5 V).

An input circuit of the high source voltage portion is constituted with a first inverter circuit composed of a PMOS 103 and an NMOS 104 having input terminals connected to an input terminal I of the input circuit and a second inverter circuit composed of a PMOS 105 and an NMOS 106 and supplied with an output of the first inverter circuit as an input. An output of the second inverter circuit is connected to an output terminal O of the input circuit.

In FIG. 5, when the PMOS 108 and the NMOS 109 on the low source voltage side are turned OFF and ON, respectively, and a signal potential at the input terminal I is changed from high level to low level, that is, from a potential of the low voltage source terminal V1 to a ground potential, the PMOS 103 and the NMOS 104 of the first inverter circuit on the high voltage source side are turned ON and OFF, completely. Therefore, its output achieves a potential of the high voltage source terminal V2. The PMOS 105 and the NMOS 106 of the second inverter circuit respond to this potential to turn OFF and ON, respectively. Thus, the potential at the output terminal O achieves a low level, that is, ground potential, causing no problem to occur.

However, when the PMOS 108 and the NMOS 109 on the low voltage source side are turned ON and OFF, respectively, and the signal potential at the input terminal I is changed from a low level to a high level, that is, from the ground potential to the potential of the low voltage source terminal V1, the NMOS 104 of the first inverter circuit on the high voltage source side is turned ON.

Since, in this case, the PMOS 103 of the first inverter circuit is supplied at its gate with the potential of the low voltage source terminal V1 and at its source with the potential of the high voltage source terminal V2, a voltage V1–V2 is applied between the gate and the source. When this voltage between the gate and the source is lower in a negative direction than a threshold voltage (negative value) of the PMOS 103, that is, when the voltage is larger in absolute value than the threshold value, the PMOS 103 is turned ON, so that a current path is formed from the high voltage source terminal V2 through the PMOS 103 and the NMOS 104 to the ground terminal, through which a current flows constantly. This current is also referred to as "through-current".

Assuming that, for example, the voltage of the low voltage source terminal V1 is 3 V and the voltage of the high voltage source terminal V2 is 5 V, a voltage of –2 V is applied between the gate and the source of the PMOS 103. Since the threshold voltage $V_{TP}$ of the usual PMOS 103 is in the order of –0.8 V, the PMOS 103 becomes fully ON.

By setting an ON resistance of the NMOS 104 to a value considerably smaller than an ON resistance of the PMOS 103, it is possible to make the output of the first inverter circuit as low as the ground potential regardless of the fact that both the PMOS 103 and the NMOS 104 are in ON state. In this case, the PMOS 105 and the NMOS 106 of the second inverter circuit are turned ON and OFF, respectively, and the signal level at the output terminal O becomes high level, that is, the potential of the high voltage source terminal V2.

As mentioned above, in the circuit construction shown in FIG. 5 which uses the CMOS inverter circuits, the required level conversion is possible. However, since, when the potential at the input terminal I is in a high level, the PMOS 103 of the first inverter circuit is not turned OFF, a current path is formed from the high voltage source terminal through the PMOS 103 and the NMOS 104 to the ground terminal. Therefore, for an integrated circuit including a number of the level conversion circuits each shown in FIG. 5, power consumption is increased.

In order to solve the problems of the level conversion circuit shown in FIG. 5, a level conversion circuit shown in FIG. 6 has been proposed.

The level conversion circuit shown in FIG. 6 includes, in addition to the elements constructing the level conversion circuit shown in FIG. 5, an enhancement NMOS 501 having a drain connected to the input terminal I, a gate connected to the high voltage source terminal V2 and a source connected to the input of the first inverter circuit composed of the PMOS 103 and the NMOS 104 and a PMOS 102 having a drain connected to the input of the first inverter circuit, a gate connected to the output of the first inverter circuit and a source connected to the high voltage source terminal V2.

In FIG. 6, when the PMOS 108 and the NMOS 109 are turned OFF and ON, respectively, and the potential at the input terminal I changes from the potential level of the low voltage source terminal V1 to the ground potential, the NMOS 501 is turned ON. Therefore, the input potential of the first inverter circuit composed of the PMOS 103 and the NMOS 104 is reduced and thus the output potential of the first inverter circuit is increased, so that the PMOS 102 and the NMOS 106 constituting the second inverter circuit are turned OFF and ON, respectively. Therefore, the output terminal O thereof achieves a low level, that is, the ground potential.

On the contrary, when the PMOS 108 and the NMOS 109 are turned ON and OFF, respectively, and the potential at the input terminal I increases from the ground potential to the potential level of the low voltage source terminal V1, the input of the first inverter circuit composed of the PMOS 103 and the NMOS 104 becomes high level since the NMOS 501 is initially in ON state. Therefore, the NMOS 104 is turned ON and the output of the first inverter circuit becomes low level to turn the PMOS 102 ON.

With the PMOS 103 being turned ON, the potential at the input of the first inverter circuit is pulled up to the potential level of the high voltage source terminal V2, so that the PMOS 103 is fully turned OFF. Simultaneously, the output of the second inverter circuit composed of the PMOS 105 and the NMOS 106 is inverted and the output terminal O is pulled up to the potential level of the high voltage source terminal V2.

As mentioned above, in the level converter circuit shown in FIG. 6, since, when the input terminal I is at the potential of the low voltage source terminal V1, the gate potential of the PMOS 103 of the first inverter circuit is pulled up to the potential level of the high voltage source terminal V2 through the PMOS 102, the PMOS 103 is fully turned OFF and, therefore, the current path which is formed in the conventional circuit shown in FIG. 5 through the PMOS 103 and the NMOS 104 is not formed.

However, in the level converter circuit shown in FIG. 6, there is another problem that, when a difference in voltage between the low voltage source terminal V1 and the high voltage source terminal V2 is large, a current path is formed from the high voltage source terminal V2 through the PMOS 102, the NMOS 501 and PMOS 108 to the low voltage source terminal V1.

That is, in order to turn the NMOS 501 OFF when the input terminal I is in high level, the voltage difference V2–V1 must be smaller than the threshold voltage VTN of the NMOS 501. An amount of current flowing from the high voltage source terminal V2 to the low voltage source terminal V1 when the above condition is not satisfied, that is, V2–V1≧VTN, is smaller than that of the current flowing through the PMOS 103 and the NMOS 104 of the conventional circuit shown in FIG. 5. However, when the number of level converter circuits used in an integrated circuit is large, power consumption therein is still large.

As a modification of the level conversion circuit shown in FIG. 6, the gate electrode of the NMOS 501 may be connected to not the high voltage source terminal V2 but to the low voltage source terminal V1. As another modification, an intermediate voltage between the voltage of the low voltage source terminal V1 and the voltage of the high voltage source terminal V2 is generated suitably and applied to the gate electrode of the NMOS 501.

In the former modification, however, the high level voltage at the input of the first inverter circuit composed of the PMOS 103 and the NMOS 104, that is, the output voltage of the NMOS 501, is the potential V1 of the low voltage source terminal V1 reduced by the threshold voltage VTN of the NMOS 501. Therefore, if V1 is low, the potential at the input of the first inverter circuit becomes short, that is, too low, causing the first inverter circuit to be inoperable.

In the latter modification, when the intermediate voltage is closer to the potential at the high voltage source terminal V2, the same current path as that formed in the level conversion circuit shown in FIG. 6 is formed from the high voltage source terminal V2 to the low voltage source terminal V1 and, when the intermediate voltage is closer to the potential at the low voltage source terminal V1, the first inverter circuit becomes inoperable. Therefore, the setting range of the intermediate voltage value is narrow, causing the design thereof to be not easy.

FIG. 7 shows another conventional level conversion circuit which is proposed in Japanese Patent Application Laid-open No. H2-134918 to improve the problems of the level conversion circuit shown in FIG. 6. The level conversion circuit shown in FIG. 7 differs from the level conversion circuit shown in FIG. 6 in that the NMOS 501 in FIG. 6 is replaced by a depletion type NMOS 601 having a gate electrode connected to the output of the first inverter circuit composed of the NMOS 103 and the NMOS 104.

In FIG. 7, when the potential at the input terminal I changes from the potential level of the low voltage source terminal V1 to the ground potential level, that is, at a leading edge of the potential, the depletion NMOS 601 becomes in ON state and thus the input and the output of the first inverter circuit composed of the PMOS 103 and the NMOS 104 are changed to low level and high level, respectively. Therefore, the PMOS 102 is turned OFF and the depletion NMOS 601 is ONed deeper, so that the input of the first inverter circuit is lowered to the ground potential. Consequently, the output terminal O of the second inverter circuit composed of the PMOS 105 and the NMOS 106 is changed from high level to low level.

On the contrary, when the potential at the input terminal I changes from the ground potential level to the potential of the low voltage source terminal V1, that is, at the leading edge of the potential, the depletion NMOS 601 achieves an OFF state since the gate electrode of the depletion NMOS 601 is applied with the voltage of the high voltage source terminal V2 and the PMOS 102 becomes in ON state. Thus, the input of the first inverter circuit is changed to the potential level of the low voltage source terminal V1 and the output thereof is changed to low level.

Then, the depletion NMOS 601 having the gate electrode supplied with the output voltage of the first inverter circuit is changed to the OFF state. Further, since the PMOS 102 is turned ON, the input potential of the first inverter circuit is changed from the potential of the low voltage source terminal V1 to the potential of the high voltage source terminal V2, so that it is possible to completely turn the PMOS 103 of the first inverter circuit OFF. Since the input of the second inverter circuit is changed from the potential of the high voltage source terminal V2 to the ground potential, the output terminal O of the second inverter circuit is changed from the ground potential level to the potential level of the high voltage source terminal V2.

In the level conversion circuit shown in FIG. 7, when the potential of the input terminal I is the potential of the low voltage source terminal V1, the current path through the PMOS 103 and the NMOS 104 are cut by the presence of the PMOS 102. Further, NMOS 601, cuts the current path from the high voltage source and the low voltage source because the gate potential thereof is set to the ground potential.

In order to make the lower limit of the threshold voltage VTN of the NMOS 601 −V1 and to discharge the input of the first inverter circuit by the NMOS 601 having the gate grounded, the upper limit of the threshold voltage VTN must be at least smaller than 0 V. Therefore, in the level conversion circuit shown in FIG. 7, the NMOS 601 must be of the depletion type.

In the level conversion circuit shown in FIG. 7, an increase in power consumption due to formation of extra current paths is prevented as mentioned above. However, when such circuit is mounted on a CMOS integrated circuit, its fabrication becomes complicated and expensive due to the use of the depletion type NMOS.

SUMMARY OF THE INVENTION

An object of the present invention is, therefore, to provide a transistor circuit suitable for a level conversion circuit operating with reduced power consumption.

A transistor circuit according to the present invention includes a first and a second MOS transistors connected in parallel between an input terminal supplied with an input signal and an input node of an inverter circuit, a control electrode of the first enhancement MOS transistor being connected to an output node of the inverter circuit, a control electrode of the second enhancement MOS transistor being supplied with a bias voltage, and a third MOS transistor having a control electrode connected to the output node of the inverter circuit and provided between the input node of the inverter circuit and a power terminal.

BRIEF DESCRIPTION OF THE DRAWINGS

The above objects, advantages and features of the present invention will be more apparent from the following description taken in conjunction with the accompanying drawings, in which.

DETAILED DESCRIPTION OF THE PREFERRED EMBODIMENTS

Figure 1:
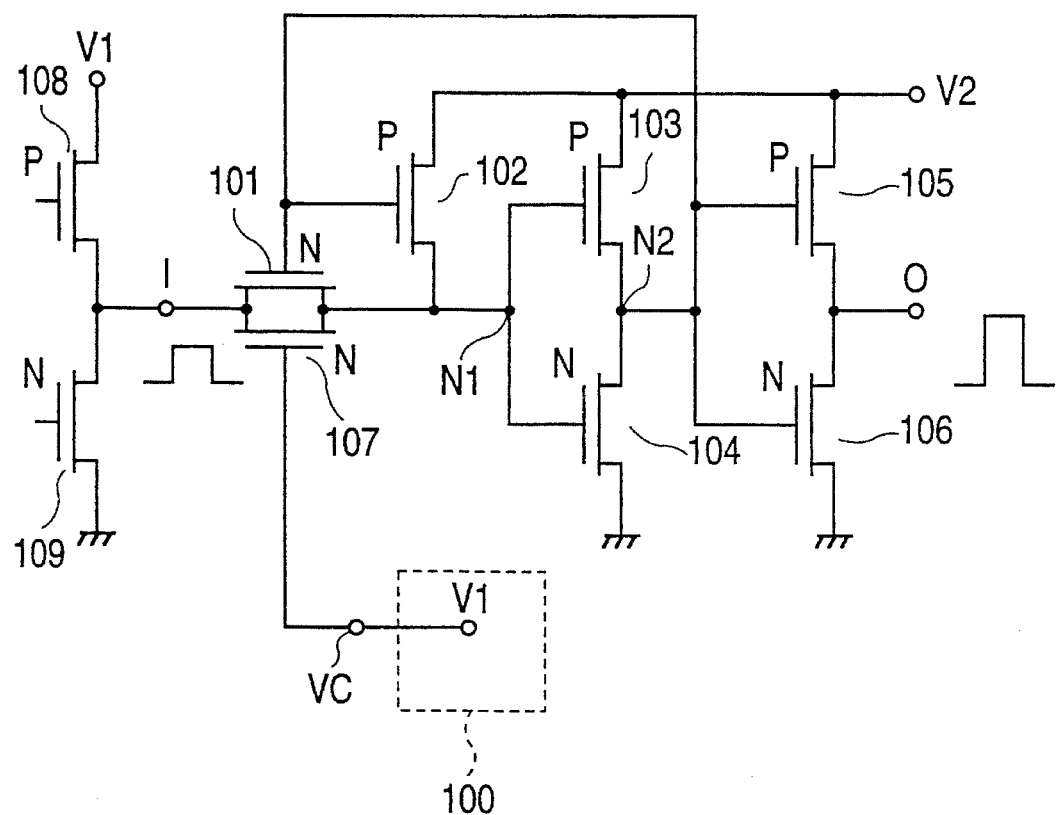
FIG. 1 is a circuit diagram showing an embodiment of a level conversion circuit according to the present invention.

Referring now to FIG. 1, a level conversion circuit according to a first embodiment of the present invention, a first enhancement N channel MOS transistor 101 has a drain connected to an input terminal I of the level conversion circuit, a gate connected to an output of a first inverter circuit composed of a PMOS 103 and an NMOS 104 provided between a high voltage source terminal V2 and a ground terminal and a source connected to an input of the first inverter circuit.

A second enhancement N channel MOS transistor 107 has a drain connected to the input terminal I, a gate connected to a constant voltage terminal VC of a constant voltage supply portion 100 and a source connected to the input of the first inverter circuit.

An enhancement P channel MOS transistor 102 has a drain connected to the input of the first inverter circuit, a gate connected to the output of the first inverter circuit and a source connected to a high voltage source terminal V2. The output of the first inverter circuit is connected to an input of a second inverter circuit composed of a PMOS 105 and an NMOS 106, whose output is connected to an output terminal O of the level conversion circuit.

A series circuit of a PMOS 108 and an NMOS 109 provided between a low voltage source terminal V1 having potential lower than a voltage of the high voltage source terminal V2 and a ground terminal functions as an output circuit of a circuit on the low voltage source side and does not constitute a part of the present invention.

In this embodiment, the constant voltage supply portion 100 uses the low voltage source terminal V1 directly and, therefore, a potential at the constant voltage terminal VC is equal to a high level potential of a signal input to the input terminal I of the level conversion circuit.

Figure 2:
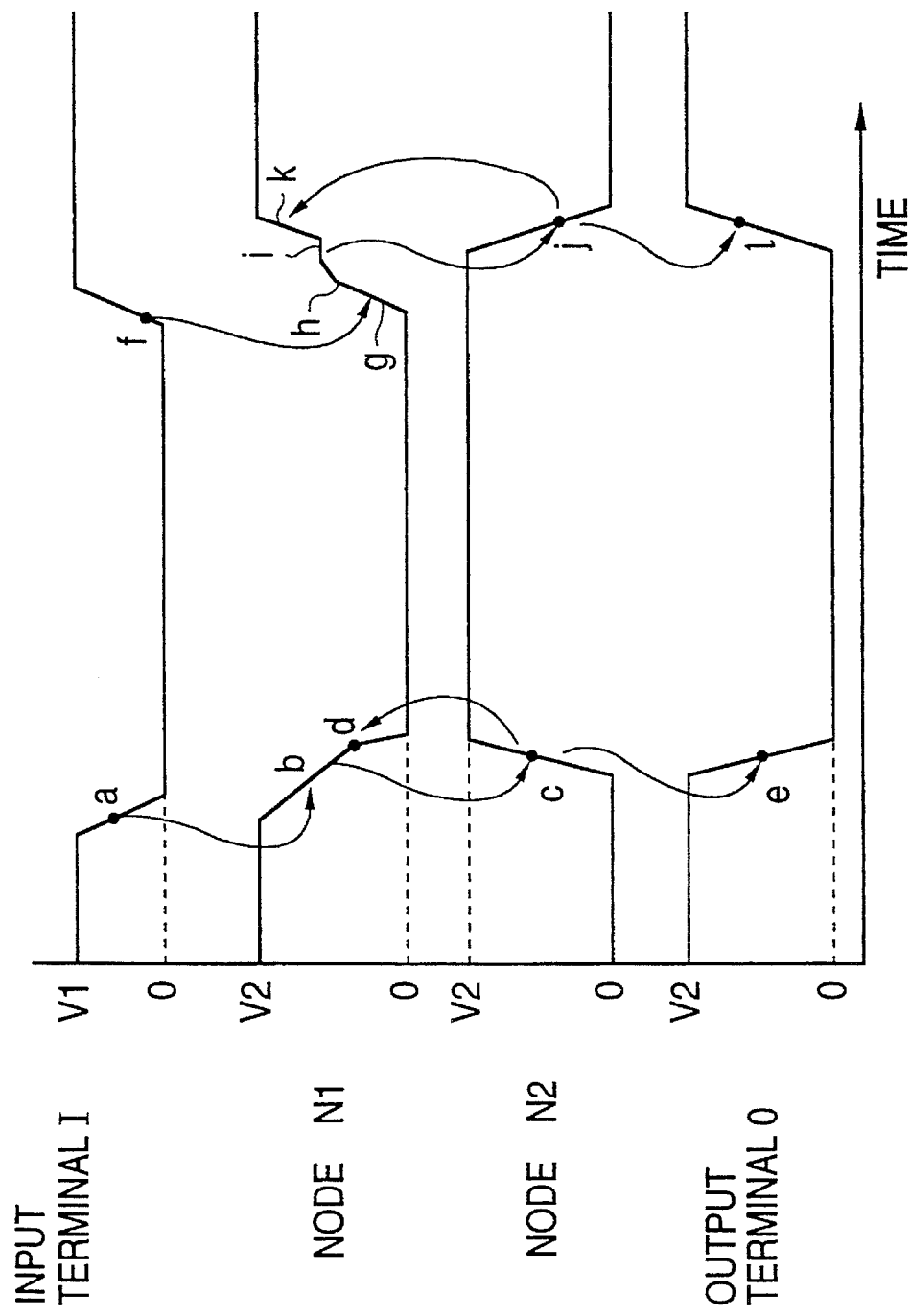
FIG. 2 shows signal waveforms indicating an operation of the embodiment of the present invention.

An operation of the level conversion circuit shown in FIG. 1 will be described in detail with reference to signal waveforms shown in FIG. 2. In FIG. 2, a waveform of the signal input to the input terminal I which has a leading edge and a trailing edge, waveforms thereof at the input (node N1) and the output (node N2) of the first inverter and a waveform thereof at the output terminal O. It should be noted that letters (a) to (l) in FIG. 2 indicate signal waveform portions which will be described in the following items indicated by the same characters, respectively.

First, when the potential at the input terminal I is in high level equal to the potential of the low voltage source terminal V1, the potentials at the input and output of the first inverter circuit composed of the PMOS 103 and the NMOS 104 equal to the potential of the high voltage source terminal V2 and to the ground potential, respectively. Therefore, the NMOS 101, the NMOS 107 and the PMOS 102 are in OFF, OFF and ON state, respectively.

(a) In this state, when the PMOS 108 and the NMOS 109 are turned OFF and ON, respectively, the potential VI at the input terminal I starts to reduce down to a value with which the potential difference between the gate and drain of the NMOS 107 becomes not smaller than the threshold voltage VT of the NMOS 107, that is, V1−VI≧VT. As mentioned previously, the voltage at the low voltage source terminal V1 is supplied to the gate of the NMOS 107 and the voltage VI at the input terminal I is supplied to the drain thereof.

(b) When the potential at the input terminal I is lowered such that the gate-drain difference voltage of the NMOS 107 becomes not smaller than the threshold voltage VT of the NMOS 107, the latter MOS becomes in ON state and the potential of the input (node N1) of the first inverter circuit composed of the PMOS 103 and the NMOS 104 starts to decrease.

(c) When the potential at the node N1 is reduced to a value equal to or smaller than the threshold value of the first inverter circuit, the potential at the output (node N2) of the first inverter circuit increases toward the potential level of the high voltage source terminal V2.

(d) With the increased potential at the output (node N2) of the first inverter circuit, the NMOS 101 and the PMOS 102 become in ON and OFF states, respectively, so that the potential at the input (node N1) of the first inverter circuit is completely pulled down to the ground potential.

Since the potential at the input (node N1) of the first inverter is pulled from the point d in FIG. 2 down to the ground potential level through the NMOS's 101 and 107, the trailing slope, that is, "through-rate", of the potential at the node N1 becomes large.

(e) Since the potential of the input (node N2) of the second inverter circuit composed of the PMOS 105 and the NMOS 106 becomes the potential level of the high voltage source terminal V2, the output thereof becomes the ground potential and thus the output terminal O of the level converter circuit becomes the ground potential.

Now, an operation of the level conversion circuit when the potential at the input terminal I changes from low level to high level will be described.

(f) In this case, the PMOS 108 and the NMOS 109 are turned ON and OFF, respectively, and the potential at the input terminal I increases from the ground potential to the potential level of the low voltage source terminal V1.

(g) At this time, the input (node N1) of the first inverter circuit composed of the PMOS 103 and the NMOS 104 is charged through the NMOS's 101 and 107.

(h) When the potential at the input (node N1) of the first inverter circuit increases to a value V1–VT, the NMOS 107 is turned OFF and, thereafter, the charging proceeds by the NMOS 101.

Since the node N1 is charged through both the NMOS's 101 and 107 initially at the leading edge, the initial slope is large and, since, when the potential at the node N1 reaches V1–VT, the NMOS 107 is turned OFF and, thereafter, the charging proceeds by only the NMOS 101, the slope becomes small.

(i) The charging is temporarily stopped when the potential of the input (node N1) of the first inverter circuit becomes either one of the potential of the low voltage source terminal V1 and the potential (V2–VTN) which is the potential of the high voltage source terminal V2 reduced by the threshold voltage VTN of the NMOS 101, which is smaller, and the NMOS 101 is turned OFF.

In more detail, when the potential of the low voltage source terminal V1 is smaller than the potential (V2–VTN) which is the potential of the high voltage source terminal V2 reduced by the threshold voltage VTN of the NMOS 101, the NMOS 101 is turned OFF at a time when the potential of the node N1 increases up to the potential V1, so that the potential of the node N1 is kept constant temporarily. On the other hand, when the potential of the low voltage source terminal V1 is larger than the potential (V2–VTN), the NMOS 101 is turned OFF at a time when the potential of the node N1 increases up to the potential V2–VTN, so that the potential at the node N1 becomes constant temporarily.

(j) The potential of the output (node N2) of the first inverter circuit is lowered toward the ground potential.

(k) With the decrease of the potential of the output (node N2) of the first inverter circuit toward the ground potential, the NMOS 101 and the PMOS 102 become in OFF and ON states, respectively, and, therefore, the potential at the input (node N1) of the first inverter circuit increases again to the potential level of the high voltage source terminal V2 in which the PMOS 103 is turned OFF completely.

(l) Since the input (node N2) of the second inverter circuit composed of the PMOS 105 and the NMOS 106 becomes the ground potential, the output thereof becomes the potential level of the high voltage source terminal V2 and the output terminal O of the level conversion circuit becomes the potential level of the high voltage source terminal V2.

Figure 6:
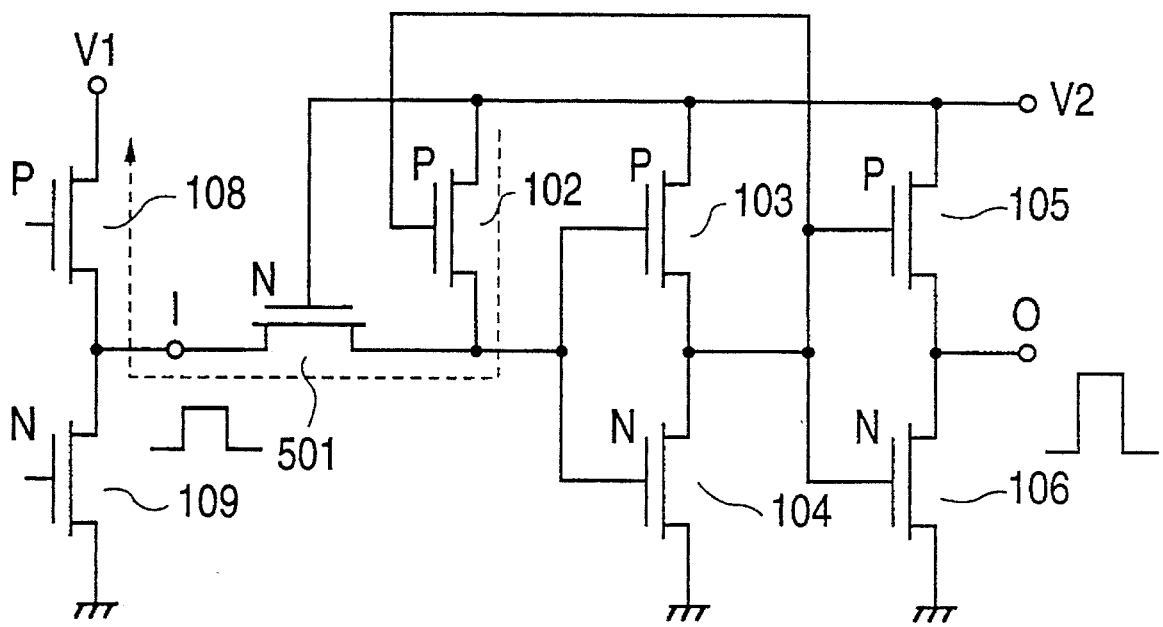
FIG. 6 is a circuit diagram of another conventional circuit.

As described, in the embodiment shown in FIG. 1 in which the first and second enhancement N channel MOS transistors 101 and 107 are connected in parallel and the constant voltage supply portion 100 is provided, there is no need for providing the depletion MOS transistor which must be used in the conventional level conversion circuit shown in FIG. 6.

That is, in this embodiment, the first and second enhancement N channel MOS transistors 101 and 107 are in an OFF state to cut the current path extending from the high voltage source terminal V2 to the low voltage source terminal V1, when the potential at the input terminal I of the level conversion circuit is in a high level.

Further, the first and second enhancement N channel MOS transistors 101 and 107 are in an ON state to reliably pull the potential at the input of the first inverter circuit down to the ground potential, when the potential at the input terminal I is at a low level.

Further, when the potential at the input terminal I changes from low level to high level, the enhancement N channel MOS transistors 101 and 107 are turned OFF and the enhancement P channel MOS transistor 102 is turned ON at a time when the potential at the input of the first inverter circuit reaches the predetermined value, so that the potential at the input of the first inverter circuit increases up to the potential level of the high voltage source terminal V2 at which the PMOS becomes in OFF state completely. Therefore, there is no current path formed from the high voltage source terminal V2 through the PMOS 103 and the NMOS 104 to the ground terminal.

The threshold voltages VTN and VT of the first and second enhancement N channel MOS transistors 101 and 107 may be the same as a matter of course.

Figure 3:
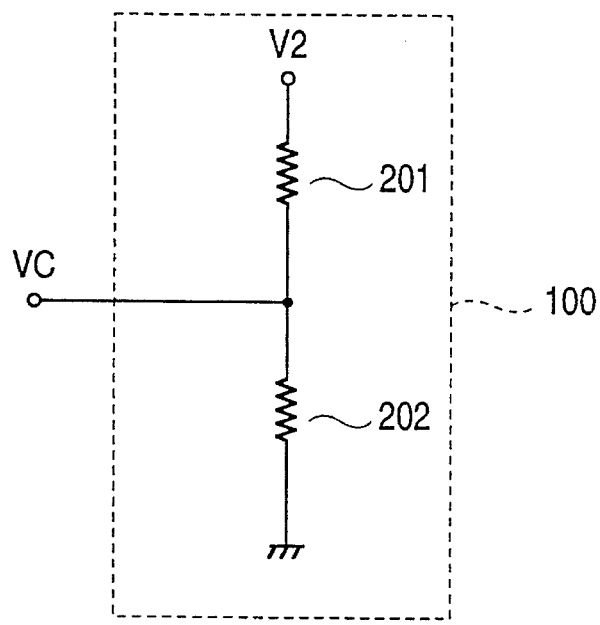
FIG. 3 is a circuit diagram showing another embodiment of a constant voltage supply portion.

FIG. 3 shows a second embodiment of the constant voltage supply portion 100 shown in FIG. 1. In FIG. 3, the constant voltage supply portion 100 is constituted with a series connection of a pair of resistors. As shown in FIG. 3, a series circuit of resistors 201 and 202 is provided between the high voltage source terminal V2 and the ground terminal and a junction of these resistors is connected to the constant voltage terminal. Since an internal construction of the constant voltage supply portion 100 is the same as that of the level conversion circuit shown in FIG. 1, details thereof are not shown in FIG. 3.

In order for the enhancement N channel MOS transistor 107 to cut the current path from the input of the first inverter circuit charged to the potential of the high voltage source terminal V2 by the enhancement P channel MOS transistor 102 to the input terminal I of the level conversion circuit when the signal input to the input terminal I is in high level VH which is equal to the potential of the low voltage source terminal V1 in FIG. 1, the potential of the constant voltage terminal VC must be lower than a sum of the high level VH of the signal input to the input terminal I and the threshold voltage VT of the enhancement N channel MOS transistor 107.

On the other hand, in order to discharge the input node N1 of the first inverter by the NMOS 107 when the signal input to the input terminal I is in low level VL (ground potential), the potential of the constant voltage terminal VC must be higher than a sum of the low level potential VL and the threshold voltage VT of the NMOS 107.

Therefore, values R1 and R2 of the resistors 201 and 202 must satisfy the following inequality.

$$VL+VT<[R2/(R1+R2)]V2<VH+VT \tag{1}$$

In a case where the level conversion circuit of the present invention is used in a circuit of an input interface portion of an integrated circuit in which there is no low voltage source terminal, it is preferable to use the constant voltage supply portion 100 shown in FIG. 2. Since the single constant voltage supply portion 100 can supply constant voltage to the enhancement N channels MOS transistors 107 of a plurality of input circuits, power consumption in the constant voltage supply portion 100 is small.

More specifically, the input impedance of the gate electrode of the enhancement N channel MOS transistor 107 of the level conversion circuit is very high and functions as a capacitive load. In the integrated circuit to which the present invention is applied, a transient current for charging and discharging a capacitance of the gate of the enhancement N channel MOS transistor 107 flows during a short time period from a time at which a power switch is closed till a time at which the potential of the constant voltage terminal is stabilized. After the potential of the constant voltage terminal is stabilized, a current flows only through the resistors 201 and 202 and therefore power consumption in the constant voltage supply portion 100 has no dependency on the number of level conversion circuits.

Figure 4:
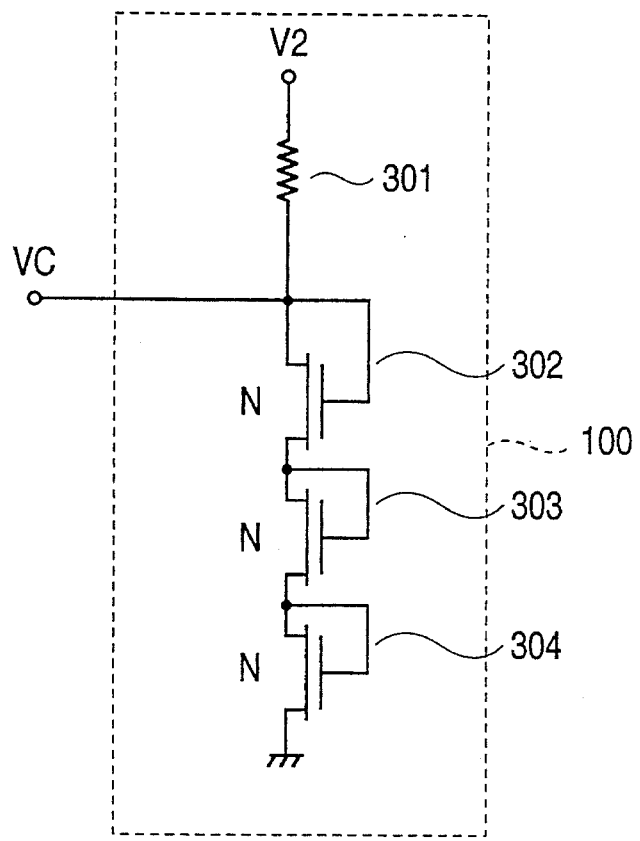
FIG. 4 is a circuit diagram showing a further embodiment of the constant voltage supply portion.
Figure 5:
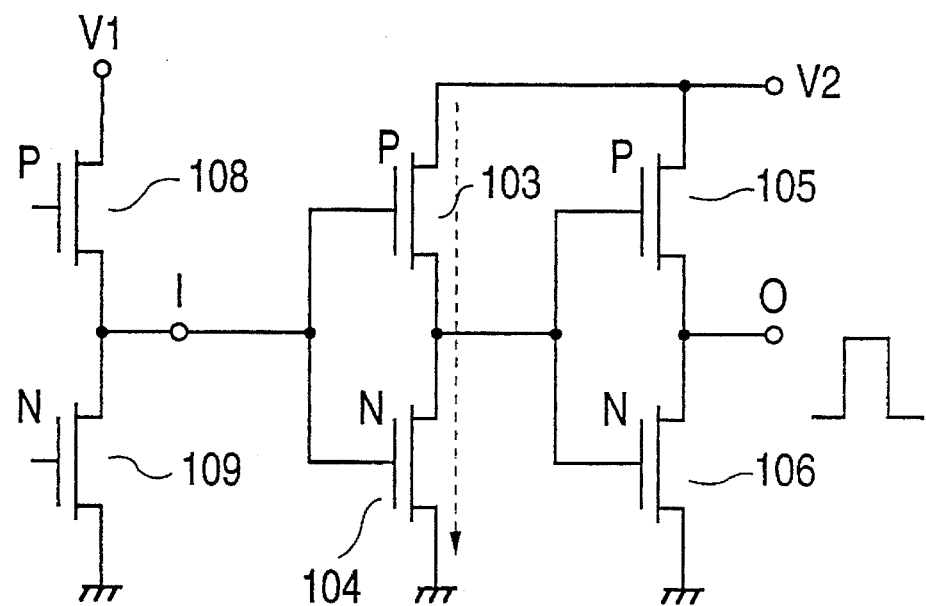
FIG. 5 is a circuit diagram of a conventional circuit.

FIG. 4 shows a third embodiment of the constant voltage supply portion 100 shown in FIG. 1. In FIG. 3, the constant voltage supply portion 100 is constituted with a series circuit composed of a resistor 301 and enhancement N channel MOS transistors 302, 303 and 304 is provided between the high voltage source terminal V2 and the ground terminal. Gate electrodes of the enhancement N channel MOS transistor 302, 303 and 304 are connected to drains thereof, respectively, forming MOS diodes and a junction between the resistor 301 and the enhancement N channel MOS transistor 302 is connected to the constant voltage terminal VC.

In FIG. 4, it is possible to supply a potential which is a sum of threshold voltages of the enhancement N channel MOS transistors 302, 303 and 304 to the constant voltage terminal VC by setting a resistance value of the resistor 301 considerably larger than resistance values of the diode-connected NMOS transistors 302, 303 and 304.

Although, in FIG. 4, the number of the diode-connected NMOS transistors is three, the number can be suitably selected. In this case, the potential of the constant voltage terminal VC must be higher than a sum of the low level potential VL of the input terminal I shown in FIG. 1 and the threshold voltage VT of the enhancement N channel MOS transistor 107 and lower than a sum of the high level potential VH of the input terminal I and the threshold voltage VT of the enhancement N channel MOS transistor 107, as described with respect to FIG. 3.

Assuming that n enhancement N channel MOS transistors are used in the constant voltage supply portion 100 as MOS diodes each having a threshold voltage equal to the threshold voltage VT of the NMOS 107, the above condition can be expressed by the following inequality.

$$VTL+VT<n \; VT<VH+VT \quad (2)$$

Therefore, the number (n) of the enhancement N channel MOS transistors to be used is defined by the following inequality.

$$(VL/VT)+1<n<(VH/VT)+1 \quad (3)$$

Assuming, for example, low level potential VL=0.4 V, high level potential VH=2.4 V and threshold voltage VT=0.8 V, it is clear from the inequality (3) that the number (n) of the MOS diodes required is two or three.

Similarly to the constant voltage supply portion shown in FIG. 3, the constant voltage supply portion shown in FIG. 4 is effectively used in an input circuit of an integrated circuit having no low voltage source terminal therein and can supply constant voltage to a plurality of enhancement N channel MOS transistors 107. Further, since the constant voltage supply portion shown in FIG. 4 supplies a voltage n times the threshold voltage of the enhancement N channel MOS transistor, it is more stable with respect to a variation of the power source voltage, compared with the constant voltage supply portion shown in FIG. 3.

On the other hand, although the constant voltage supply portion shown in FIG. 3 allows a fine regulation of the constant voltage by changing the setting of the values of the resistors, such fine regulation of the constant voltage in the constant voltage supply portion shown in FIG. 4 is not so easy.

In the embodiments shown in FIGS. 3 and 4, it is clear that each of the resistors 201, 202 and 301 may be replaced by a MOS transistor having a gate biased. Further, it is of course possible to provide the constant voltage supply portion 100 in the integrated circuit or provide it as an external circuit to be associated with the integrated circuit. Further, it is possible to use a variable resistor such as semi-fixed resistor or trimmer as the resistor 202, etc., of the constant voltage supply portion 100 shown in FIG. 3, for regulation of the constant voltage.

Although the present invention has been described with respect to the embodiments, the present invention is not limited to them and various other embodiments and modifications fall within the scope of the present invention which is defined by the appended claims. For example, the NMOS pass transistors such as the first and second enhancement N channel MOS transistors 101 and 107, etc., used in the described embodiments may be replaced by CMOS pass transistors including enhancement P channel MOS transistors, with similar effect.

Figure 7:
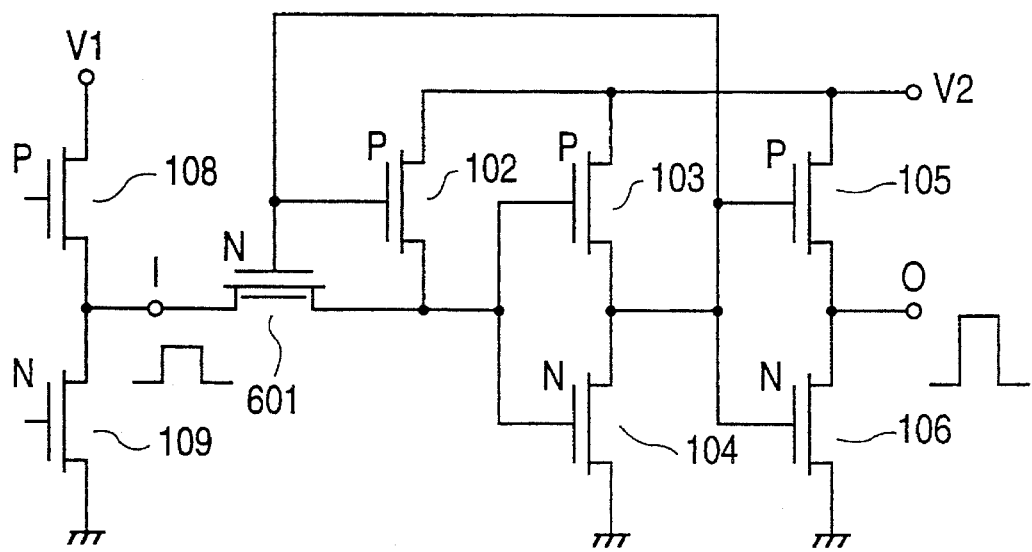
FIG. 7 is a circuit diagram of a further conventional circuit.

As described, the depletion NMOS transistor provided in the conventional level conversion circuit (see FIG. 7) is replaced by the parallel-connected enhancement MOS transistors and the constant voltage supply portion for supplying a predetermined voltage to the gate of one of these enhancement MOS transistors. Therefore, the fabrication of the level conversion circuit to be incorporated in an integrated circuit is simplified due to absence of the depletion MOS transistor and thus the fabrication cost thereof can be reduced and reduction of power consumption and stability of circuit operation are achieved.

According to the present invention, the two enhancement MOS transistors are preferably N channel MOS transistors, so that fabrication of the level conversion circuit in an integrated circuit including enhancement P channel MOS transistors and N channel MOS transistors is simplified.

Further, according to the present invention, it is possible to obtain an output signal at an output terminal of the level conversion circuit which is in phase with an input signal to an input terminal thereof and has a potential level converted into a potential of a high source voltage, due to the use of a series connected two inverter circuits.

Further, according to the present invention, a voltage equal to the voltage at the low voltage source terminal is supplied from the constant voltage supply portion to the gate, that is, the control electrode, of one of the enhancement N channel MOS transistors and, when the potential at the input terminal is high level, the current path from the high voltage source terminal to the low voltage source terminal is cut to achieve a reduction of power consumption and, when the potential at the input terminal is low level, the potential at the input of the inverter circuit connected to the source electrodes of the enhancement N channel MOS transistors is reliably pulled down to the ground potential to achieve a stabilized operation of the circuit.

In the present invention, the constant power supply portion has a simple construction composed of the resistive elements functioning a voltage divider dividing the high source voltage to a predetermined voltage, it is possible to restrict power consumption regardless of the number of level conversion circuits.

Further, in the present invention, the constant power supply portion has a simple construction composed of the series circuit of the resistive element and the diode elements, it is possible to supply a stable voltage with respect to a variation of a source voltage and to restrict power consumption regardless of the number of level conversion circuits.

Further, in the present invention, the potential of the constant voltage terminal for supplying voltage to the gate of one of the two enhancement N channel MOS transistors is made higher than the sum of a low level potential at the input terminal and the threshold voltage of the enhancement N channel MOS transistor. Therefore, the operation of the inverter circuits become stabilized.

And, by making the potential of the constant voltage terminal lower than the sum of the high level potential of the signal input to the input terminal and the threshold voltage of the enhancement N channel MOS transistor, the current path formed from the input of the first inverter circuit charged to the potential level of the high voltage source terminal to the input terminal when the latter is in high level can be cut, contributing to reduction of power consumption and guarantee a stabilized circuit operation.

In the level conversion circuit according to the present invention, the inverter circuits comprises CMOS inverters each composed of a PMOS and an NMOS, with which reduction of power consumption is achieved and the constant current flow in the CMOS inverter, that is, the through current, is prevented.

What is claimed is:.

1. A transistor circuit comprising an input terminal supplied with an input signal, an output terminal, a first inverter having an input node and an output node, means for coupling the output node of said first inverter to said output terminal, a first and second enhancement MOS transistors having current paths thereof connected in parallel to each other and connected between said input terminal and the input node of said first inverter, means for coupling a control electrode of said first enhancement MOS transistor to the output node of said first inverter, means for supplying a control electrode of said second enhancement MOS transistor with a bias voltage, and a third MOS transistor having a source-drain path connected between the input node of said first inverter and a power supply terminal and a gate electrode coupled to the output node of said first inverter.

2. The transistor circuit as claimed in claim 1, wherein each of said first and second enhancement MOS transistors is of a first channel type and said third MOS transistor is of a second channel type.

3. The transistor circuit as claimed in claim 1, wherein said means for coupling the output node of said first inverter comprises a second inverter having an input node coupled to the output node of said first inverter and an output node coupled to said output terminal.

4. A signal level conversion circuit comprising a first voltage source power terminal, a second voltage source power terminal, an input terminal, an output terminal, first and second inverter circuits each connected between said first and second voltage source power terminals, first and second enhancement MOS transistors of a first channel type, a third MOS transistor of a second channel type, and a constant voltage generator, said first enhancement MOS transistor having a source-drain path connected between said input terminal and an input node of said first inverter circuit and a gate connected to an output node of said first inverter circuit, said second enhancement MOS transistor having a source-drain path connected between said input terminal and the input node of said first inverter circuit and a gate connected to said constant voltage generator, said third MOS transistor having a source-drain path connected between the input node of said first inverter circuit and said first voltage source power terminal and a gate connected to the output node of said first inverter circuit, the output node of said first inverter circuit being connected to an input node of said second inverter circuit, and an output node of said second inverter circuit being connected to said output terminal.

5. The signal level conversion circuit as claimed in claim 4, wherein said first voltage source power terminal has a potential greater than a potential generated by said constant voltage generator.

6. The signal level conversion circuit as claimed in claim 5, wherein said constant voltage generator generates a voltage level associated with a logic level of an input signal supplied to said input terminal.

7. The signal level conversion circuit as claimed in claim 6, wherein said constant voltage generator generates a voltage level greater than a threshold voltage of said second enhancement MOS transistor and smaller than a sum of the threshold voltage of said second enhancement MOS transistor and the logic level of said input signal inputted to said input terminal.

* * * * *